(12) United States Patent
Wong et al.

(10) Patent No.: US 8,593,325 B2
(45) Date of Patent: Nov. 26, 2013

(54) SUCCESSIVE APPROXIMATION ANALOG-TO-DIGITAL CONVERSION

(75) Inventors: Ark-Chew Wong, Irvine, CA (US); Olivier Jacques Nys, Neuchatel (CH)

(73) Assignee: Semtech Corporation, Camarillo, CA (US)

( * ) Notice: Subject to any disclaimer, the term of this patent is extended or adjusted under 35 U.S.C. 154(b) by 43 days.

(21) Appl. No.: 13/287,978

(22) Filed: Nov. 2, 2011

(65) Prior Publication Data

US 2013/0106630 A1 May 2, 2013

(51) Int. Cl.
*H03M 1/34* (2006.01)
(52) U.S. Cl.
USPC ........... 341/163; 341/155; 341/160; 341/165; 330/279; 330/296; 327/535; 345/76; 345/82; 345/102; 345/690; 345/692; 375/335; 375/343
(58) Field of Classification Search
USPC ........... 341/130–165; 330/279, 296; 327/535; 345/76, 82, 102, 690, 692; 375/143, 375/335, 343
See application file for complete search history.

(56) References Cited

U.S. PATENT DOCUMENTS

| | | | | |
|---|---|---|---|---|
| 5,661,483 A * | 8/1997 | Negahban et al. | ............ | 341/161 |
| 7,265,611 B2 * | 9/2007 | Wang | ................. | 330/9 |
| 7,961,131 B2 * | 6/2011 | Craninckx | .................... | 341/172 |
| 8,022,683 B2 * | 9/2011 | Thompson et al. | ........... | 323/285 |
| 8,284,090 B2 * | 10/2012 | Maurino | ....................... | 341/156 |

* cited by examiner

*Primary Examiner* — Lam T Mai
(74) *Attorney, Agent, or Firm* — McDermott Will & Emery LLP

(57) ABSTRACT

Examples of systems and methods are provided for converting an analog input signal to a digital output signal. A system may include a current mode (CM) digital-to-analog converter (DAC) circuit to provide a DAC current. A comparator circuit may be configured to generate a comparator signal in response to an error signal determined based on the DAC current and the analog input signal. A successive approximation register circuit may be configured to generate at least one of a DAC-code signal or the digital output signal, in response to the comparator signal. The DAC-code signal may be used by the CM DAC circuit to control the DAC current.

17 Claims, 12 Drawing Sheets

SUCCESSIVE APPROXIMATION ANALOG-TO-DIGITAL CONVERSION

FIELD

The disclosure relates in general to analog-to-digital conversion (ADC), and more particularly to, successive approximation ADC.

BACKGROUND

Analog-to-digital conversion (ADC) is often used to sample analog signals so that such signals may be digitally represented. The need for digital representation of analog signals arises in a variety of applications such as digital communication receivers.

A variety of techniques to perform ADC are well known in the art. Two common techniques include the successive approximation (SA) ADC and the flash ADC circuit. An SA ADC circuit generally produces a digital representation by processing an analog input signal through successive stages, each stage comprising a comparator configured to get a successively more accurate digital representation of the analog input signal. In a typical flash ADC circuit, an analog input signal value is compared with various reference levels, all at once, using multiple comparators. All other things being equal, because a flash ADC circuit has a single stage of comparators instead of multiple stages of comparators as in an SA ADC circuit, a flash ADC circuit may typically produce a digital representation of an analog input signal with lower latency than an SA ADC circuit. The flash ADC technique, therefore, has been generally considered more suitable for a high-speed application.

SUMMARY

Examples are provided for converting an analog input signal to a digital output signal. A system may include a current mode (CM) digital-to-analog converter (DAC) circuit to provide a DAC current. A comparator circuit may be configured to generate a comparator signal in response to an error signal determined based on the DAC current and the analog input signal. A successive approximation register circuit may be configured to generate at least one of a DAC-code signal or the digital output signal, in response to the comparator signal. The DAC-code signal may be used by the CM DAC circuit to control the DAC current.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known circuit elements and components are shown in block diagram form in order to avoid obscuring the concepts of the subject technology. Like components are labeled with identical element numbers for ease of understanding.

In one aspect, the disclosure relates to ultra high-speed successive approximation analog-to-digital-conversion. With the increasing demand for high data rates and constellation densities, especially in signals transmitted, for example, in the Giga Hertz (GHz) range, the demand for fast and accurate analog-to-digital converter (ADC) circuits is ever increasing. Furthermore, the rapid shrinking of CMOS technology requires modern electronic sub-systems to move in the direction of simpler analog designs coupled with intensive digital computation, which are quite attractive for system-on-chip applications. As such, successive approximation (SA) ADC circuits can be advantageously utilized. Specifically, implementations using high-speed SA ADC circuits with smaller chip real estate and low power consumption are desired.

In one aspect, the present disclosure describes a technique to use a current-mode (CM) DAC circuit in a feedback loop of a SA ADC circuit to drastically improve operational speed of the SA ADC circuit. In one aspect, many SA ADC circuits that use resistive or capacitive DAC circuits may not be able to operate properly at speeds comparable the operational speed of the CM DAC circuit of the present disclosure. Moreover, due to the simple nature of the proposed architectures, several of proposed CMSA ADC circuits can be operated in parallel to achieve a higher conversion speed.

Figure 1:
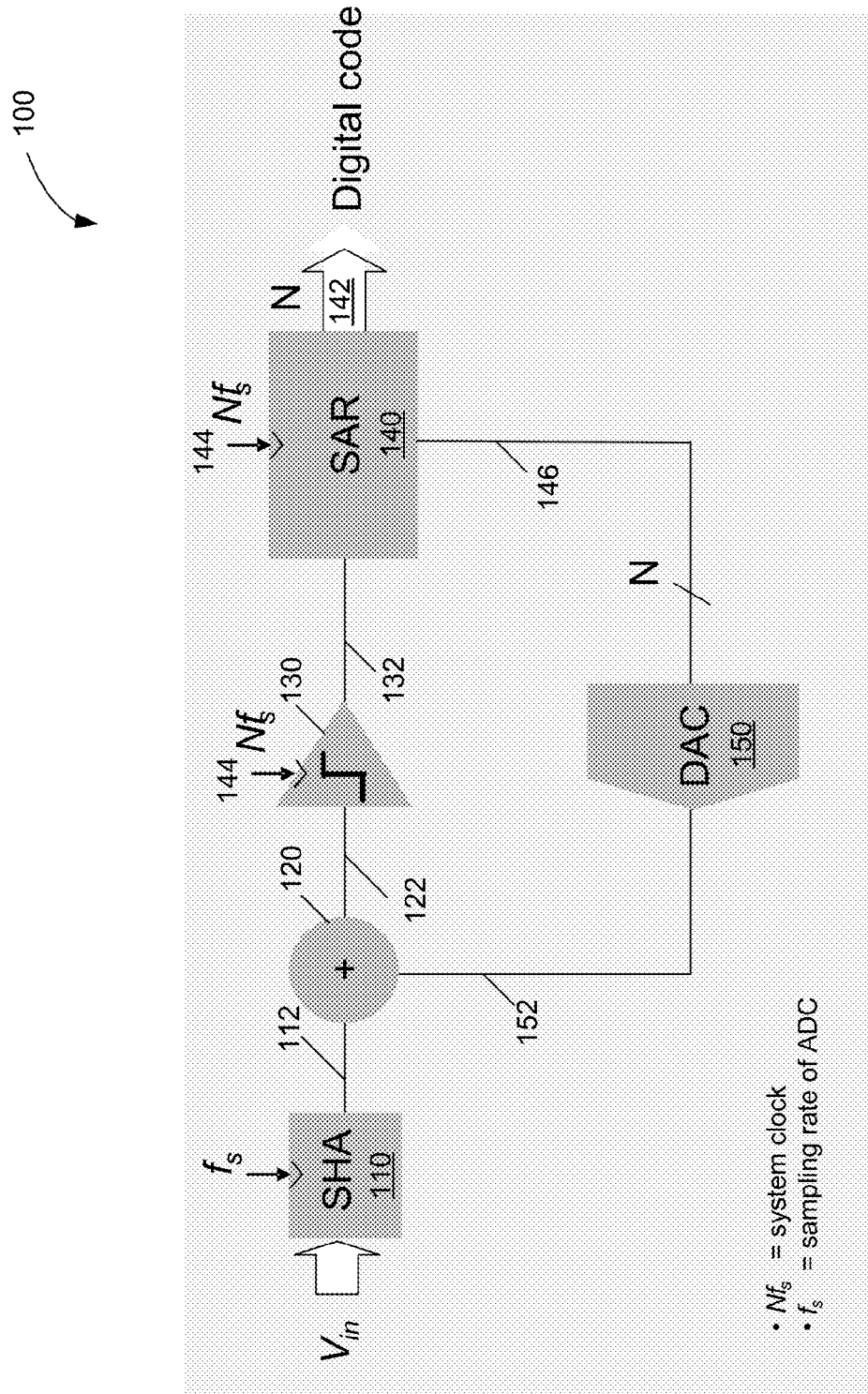
FIG. 1 is a block diagram of an example of a successive approximation (SA) analog-to-digital converter (ADC) circuit.

FIG. 1 is a block diagram of an example of a successive approximation (SA) analog-to-digital converter (ADC) circuit. SA ADC circuit 100 may include a sample and hold amplifier (SHA) 110, an error circuit 120, a comparator 130, a successive approximation register (SAR) 140, and a DAC 150. SHA 110 may be configured to sample an input voltage signal Vin at a sampling rate $f_s$, thereby generating a sampled-input voltage signal 112, comprising a number of samples per second. Sampled-input signal 112, in error circuit 120, may be combined with a DAC signal 152 to generate an error signal 122, which is received by comparator 130. If error signal 122 exceeds a predetermined threshold voltage (e.g., a few mV), comparator 130 responds by producing a comparator signal 132 at its output. SAR 140 comprises a state machine whose operation is controlled by clock pulses 144 generated by a clock generator (not shown in FIG. 1 for simplicity) at a rate $N*f_s$, where N is the highest number of bits handled by SAR 140 in one sampling period (i.e., $T_s=1/f_s$). SAR 140 performs its operation through a number N of SA cycles. During each of the SA cycles, one of the N bits of digital output signal 142 (e.g., digital code, or output code) is resolved. SAR 140, in response to comparator signal 132, generates and N-bit digital signal 146, which is used by DAC 150 to produce DAC signal 152.

Initially (i.e., at the first cycle), SAR may generate the digital signal 146 that represents a mid-code. In case of an N-bit ADC, the mid-code may, for example, comprise a digital code representing $2^{N-1}$ (e.g., $2^7=1000,0000$ for an 8-bit ADC). In successive cycles, a previous digital signal 146 is changed, in accordance with the comparator signal 132, to generate a present (i.e., current) digital signal 146, which is used by DAC 150 to produce a present DAC signal 152, which, in turn, is compared with a present sampled-input voltage signal 112 to generate a present error signal 122. For example, if the present cycle is the second cycle, and in the first cycle, sampled-input voltage signal 112 was greater than DAC signal 152 corresponding to the mid-code 1000,0000, then the next digital signal 146 is set to 1100,0000. Namely, the next most significant bit (MSB) is determined to be one. Otherwise, the same bit is set to zero and the process continues. In a final cycle, when all N bits of digital output signal 142 are resolved, digital output signal 142 is ready to be outputted as the output code.

DAC 150 may be implemented using resistors or capacitors. However, in one aspect, high accuracy resistors may not be realizable in very low feature size technologies. In addition, in one aspect, capacitor DACs may not be suitable for ultra-high speed operations. An aspect of the disclosure can address all of the foregoing issues.

Figure 2:
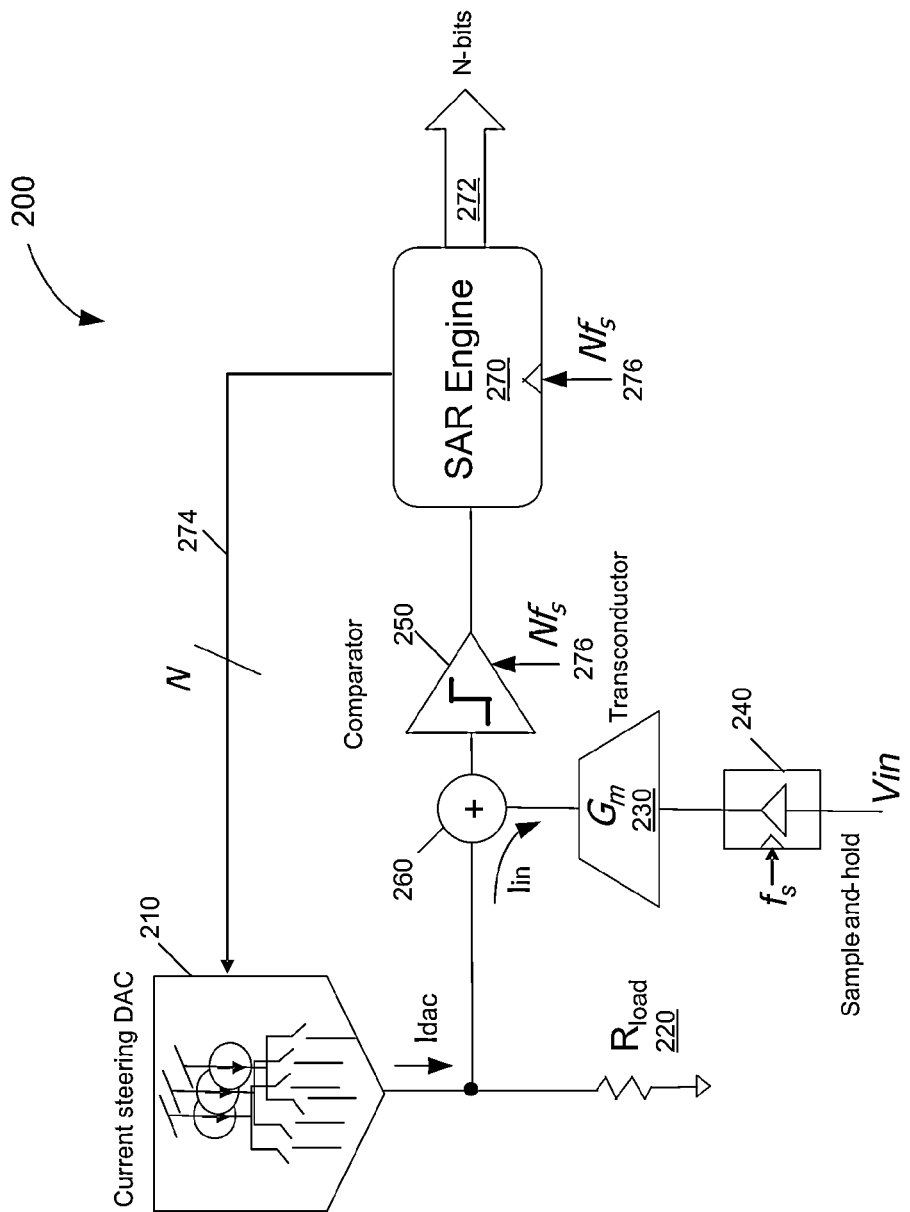
FIG. 2 is a block diagram of an example of a current-mode (CM) SA ADC circuit, in accordance with certain configurations of the present disclosure.

FIG. 2 is a block diagram of an example of a current-mode (CM) SA ADC circuit, in accordance with certain configurations of the present disclosure. CMSA ADC circuit 200 may include a CM DAC circuit (e.g., a current steering DAC) 210, a load resistor 220, a sample and hold (SH) circuit 240, a transconductance circuit 230, an error circuit 260, a comparator 250, and a SAR (e.g., SAR engine) 270. An aspect of a major distinction between CMSA ADC circuit 200 and SA ADC circuit 100 of FIG. 1 may arise from the structures and operations of CM DAC circuit 210 and error circuit 260, as compared with their corresponding blocks (e.g., DAC 150 and error circuit 120) in FIG. 1. In an additional advantageous aspect, a transconductance circuit 230 (e.g., with a transconductance ratio $G_m$) may be used to convert the sampled input voltage signal generated by SH circuit 240 to a current signal $I_{in}$. CM DAC circuit 210 is configured to generate a DAC current $I_{dac}$, in response to a digital signal (e.g., N-bit code) 274 produced by SAR 270. In one aspect, DAC current $I_{dac}$ can be analog in nature, and may be generated such that it can counter input current $I_{in}$, when combined in error circuit 260. Note that load resistor 220 (e.g., $R_{load}$) is, in essence, part of error circuit 260, and is shown separately to shed light on its use as a current-to-voltage converter.

In operation, the difference between currents $I_{in}$ and $I_{dac}$ can be converted to a voltage signal at error circuit 260, after passing through load resistor 220. The operations of comparator 250 and SAR 270 are substantially similar to the operations of comparator 130 and SAR 140 of FIG. 4. The operation of comparator 250 is synchronized with the operation of SAR 270 via a clock signal 276 (e.g., with a clock rate of $N*f_s$, where N is the highest number of bits that SAR 270 can handle). In some configurations (e.g., CMSA ADC circuit of FIG. 6), where comparator 250 comprise a current comparator, currents $I_{in}$ and $I_{dac}$ may be compared without a need for load resistance 220. An advantage of CMSA ADC circuit 200 lies in the speed of handling current sources, which the operation of CM DAC circuit 210 is based on, as compared to charging and discharging capacitors, which the operation of capacitor DAC circuits of many conventional SA ADC circuits is based on.

Another advantage of CMSA ADC circuit 200 is that CM SA ADC circuit 200 does not require a reference voltage and is self-autonomous in terms of referencing. Other advantages may include speed of operation and ease of transistor matching for implementing differential mode DAC, as compared to matching resistors or capacitors in differential DAC circuits implemented with resistor or capacitors, which may be difficult, especially at very small feature sizes.

Figure 3A:
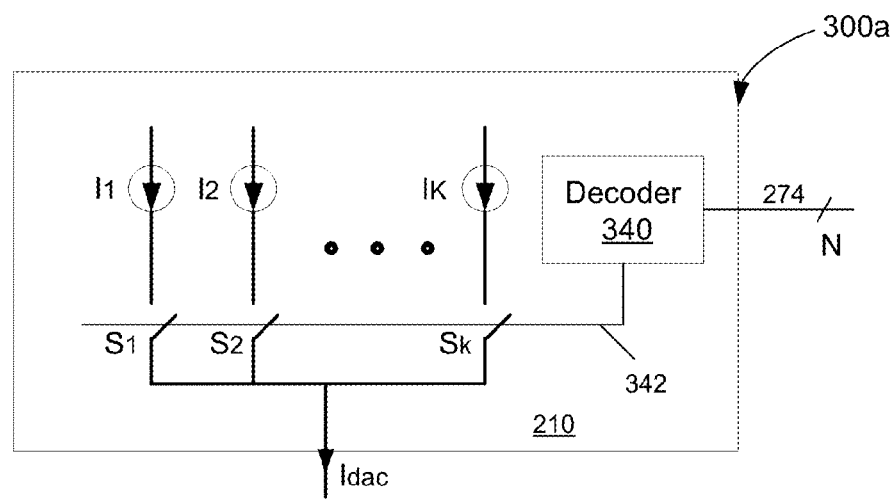
FIG. 3A is a high-level diagram of an example of a current-mode (CM) digital-to-analog converter (DAC) of the CMSA ADC circuit of FIG. 2, in accordance with certain configurations of the present disclosure.

FIG. 3A is high-level diagram of an exemplary implementation 300a of the CM DAC circuit 210 of FIG. 2, in accordance with certain configurations of the present disclosure. CM DAC circuit 210 includes a number of (e.g., K, where $K=2^N$, when SA ADC circuit 200 is an N-bit ADC) current sources each coupled to participate in forming DAC current $I_{dac}$ through switches $S_1$-$S_K$. Switches $S_1$-$S_K$ are, in turn, controlled by digital signal 274 generated by SAR 270 of FIG. 2. A decoder 340 in CM DAC circuit 210 converts the digital signal 274 to a control signal 342 that can be used by CM DAC circuit 210 to control switches $S_1$-$S_K$. In operation, an N-bit ADC circuit (e.g., CM SA ADC circuit 200 of FIG. 2) may operate based on a well-known binary search tree algorithm. In practice, an N-bit ADC circuit (e.g., CM SA ADC circuit 200 of FIG. 2) may be implemented by $K=2^N$ current sources (e.g., $I_1$-$I_K$). The control of switches may be performed by using a binary code, a thermometric code, or a combination of both. For example, in thermometric implementation, for a 4-bit ADC circuit, 15 switches may individually control 15 current sources of the 16 used current sources (e.g., $I_1$-$I_{15}$). The 16th current source (e.g., $I_0$) may be used without a switch as a static current source. In a binary code implementation, however, groups of current sources may be controlled simultaneously. For example, groups of $I_1$-$I_2$ (i.e., next 2 current sources), $I_3$-$I_6$ (i.e., next 4 current sources), and $I_7$-$I_{15}$ (i.e., next 8 current sources) may be controlled separately through three switches. Thermometric implementation may use more switches, therefore, requiring more chip area for routing control signals, while introducing less switching glitches.

Current sources $I_1$-$I_K$ and switches $S_1$-$S_K$ may be implemented by circuits using transistor elements (e.g., MOS or BJT transistors) in single or differential mode. An example differential mode implementation using MOS transistors is shown and described in FIG. 3B below.

Figure 3B:
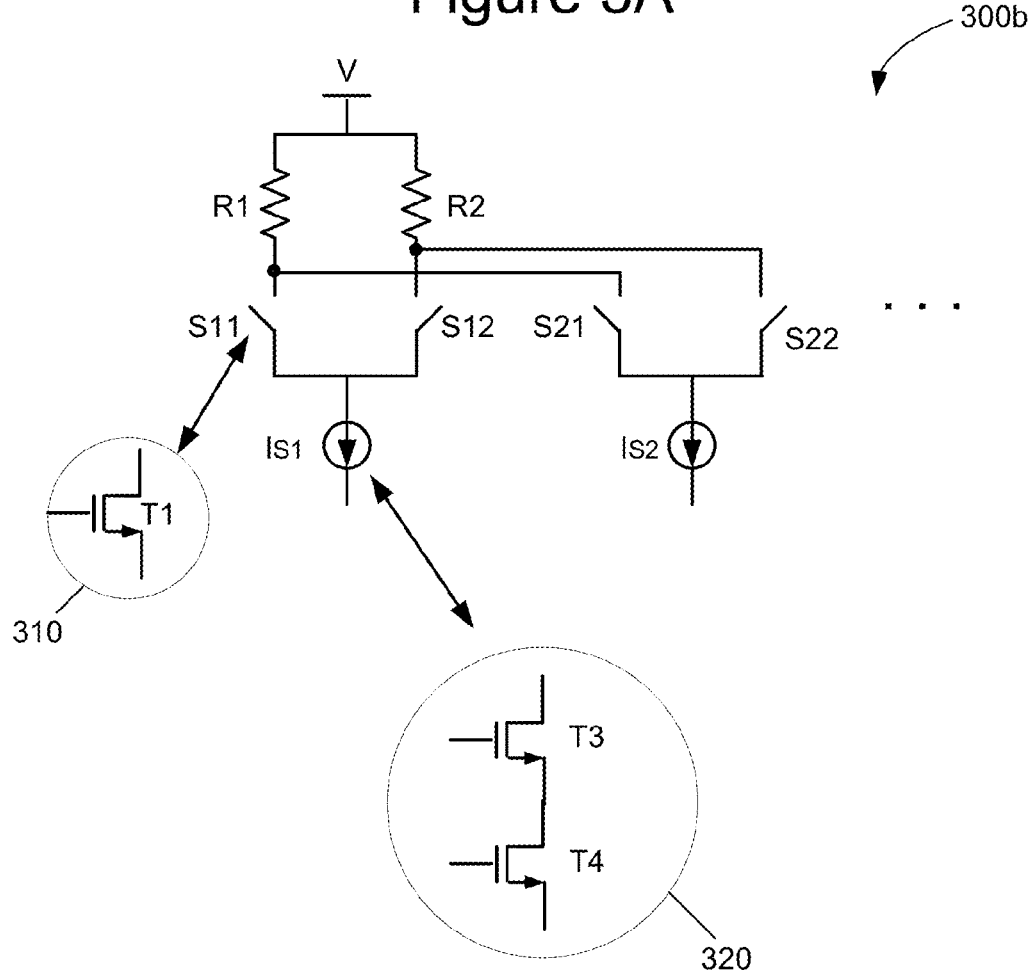
FIG. 3B is a schematic diagram illustrating an exemplary implementation of the CM DAC circuit of FIG. 3A, in accordance with certain configurations of the present disclosure.

FIG. 3B is a schematic diagram illustrating an exemplary implementation 300b of CM DAC circuit of FIG. 3A, in accordance with certain configurations of the present disclosure. In the actual implementation, a number of combinations of current sources coupled to differential switches may be used. In FIG. 3B, for simplicity, only two of such combinations are shown. Current sources $I_{S1}$ and $I_{S2}$ may selectively run through load resistors R1 and R2 via differential switch pairs $S_{11}$-$S_{12}$ and $S_{21}$-$S_{22}$. Each of the switches may be implemented by a transistor, such as transistor $T_1$ shown in circle 310. Each of the current sources may be implemented via, for example, one (e.g., NMOS transistor T4 alone) or two transistors (e.g., NMOS transistors T3 and T4, where T4 acts as a well-know cascode transistor), as shown in circle 320. In some configurations, switches $S_{11}$-$S_{12}$ and $S_{21}$-$S_{22}$ and current sources $I_{S1}$ and $I_{S2}$ may be implemented with PMOS transistors or n or p type bipolar transistors.

Figure 4:
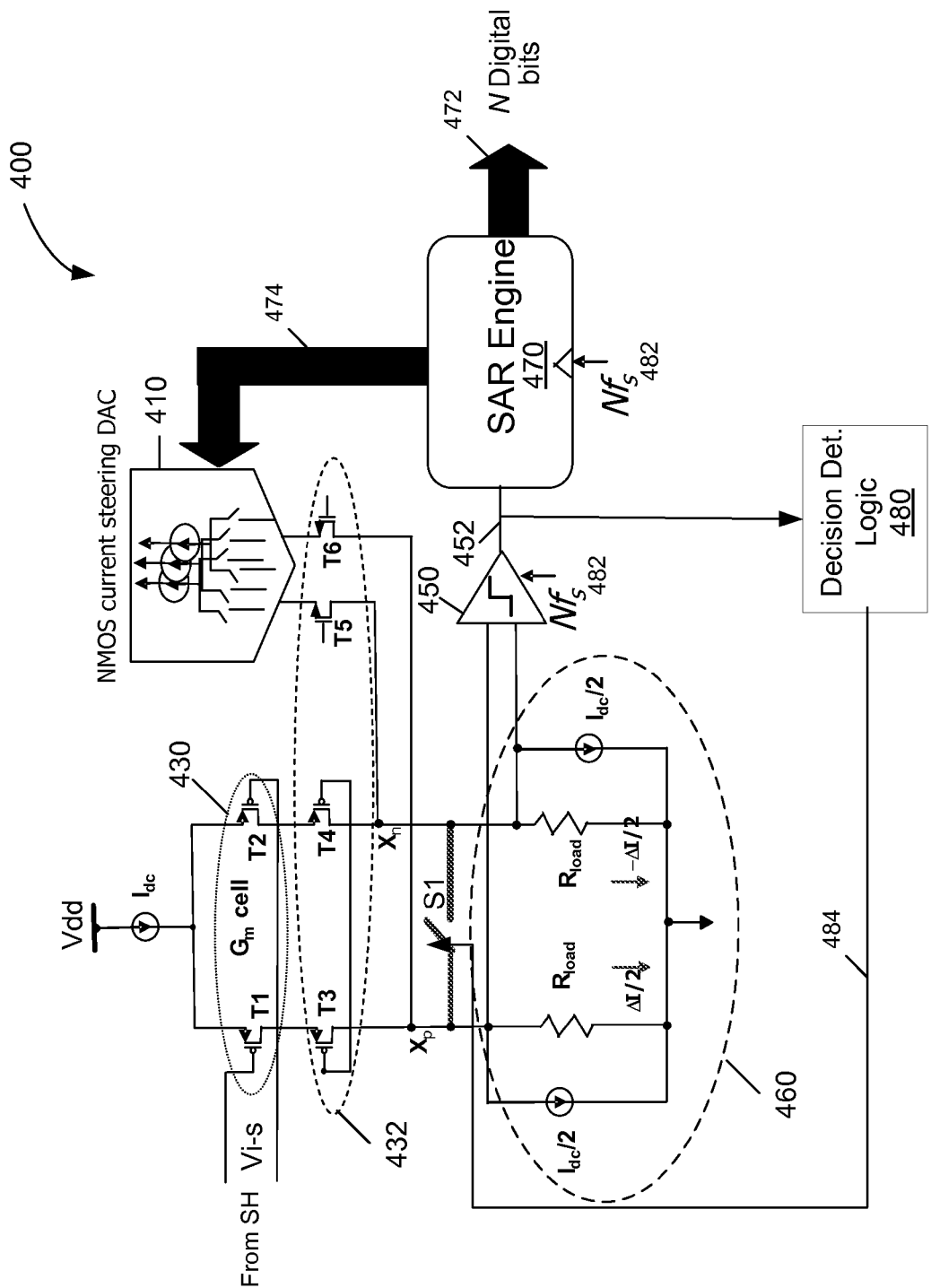
FIG. 4 is a schematic diagram illustrating an exemplary implementation of the CMSA ADC circuit of FIG. 2, in accordance with certain configurations of the present disclosure.

FIG. 4 is a schematic diagram illustrating an example of a CM SA ADC circuit, in accordance with certain configurations of the present disclosure. CM SA ADC circuit 400 may include some or all of the following: a CM DAC circuit 410, a SAR 470, a comparator 450, a clock generator 480, an error circuit 460, a cascode circuit 432, a switch S1, and a transconductance circuit 430. Comparator 450 and SAR 470 are similar to comparator 250 and SAR 270 of FIG. 2. DAC 410 is implemented with NMOS transistors and is configured to steer current away from error circuit 460. Error circuit 460 is implemented with two load resistors (e.g., $R_{load}$) and two bias current sources (e.g., $I_{dc}/2$). The bias current sources maintain a common mode voltage across input ports (e.g., nodes Xn and Xp) of comparator 450, when the steered away current by the CM DAC 410 (e.g., via NMOS transistors T5 and T6) is substantially equal to the input signal current generated by transconductance circuit 430. Transconductance circuit 430 includes a differential transistor pair formed by PMOS transistors T1 and T2, which generate, in response to the sampled-input voltage signal Vi-s, the differential input signal current (e.g., signal current in excess or less than $I_{dc}/2$ that passes through each transistor T1 or T2 in steady state, such as when sampled-input voltage signal Vi-s is substantially equal to zero). In FIG. 4, current ΔI represents the total DAC current provided through nodes Xp and Xn.

Cascode circuit 432 includes PMOS transistors T3, T4, T5, and T6. These transistors mainly act as buffers that isolate transconductance circuit 430, error circuit 460, and comparator circuit 450 from CM DAC circuit 410, in order to prevent loading of these circuits by CM DAC circuit 410, thereby maintaining high-speed operation of the CM SA ADC 400. At any cycle (e.g., successive approximation cycle of SAR 470), the signal 452 generated by comparator 450 depends on difference between voltages at nodes Xp and Xn, thereby is dependent on the difference of currents passing through the differential load resistors, $R_{load}$. In response to the signal 452, SAR circuit 470 sets a value of N-bit digital signal 474, which is received by CM DAC circuit 410 and used by CM DAC circuit 410 to control the amount of current that is steered away from nodes Xn and Xp (e.g., through cascode NMOS transistors T5 and T6). In addition, depending on the SAR cycle being performed, a respective bit of output code 472 is set. In the final cycle (e.g., Nth cycle, for a N-bit ADC), when the difference between voltages at nodes Xp and Xn substantially converges to zero, the last bit of the digital output signal is set and output code 472 is outputted, before the process of estimating the next sample of the input signal Vi-s is started.

A switch S1 (e.g., a deglitcher or return-to-zero switch) may be used to reset the voltage difference between nodes Xp and Xn to zero. Operation of switch S1 is controlled by control signal 484 issued by decision detect logic 480 (see FIG. 10), which detects a change in an output of comparator 450 during a regeneration phase of comparator 450 (see FIG. 11), and generates signal 484, which resets the voltage at nodes Xp and Xn. Switch S1 is turned off when signal 484 is returned to zero. A clock signal 482 (e.g., at a rate $N*f_s$, where, N is the highest number of bits handled by SAR 470 and $f_s$ is the sampling frequency) controls operation of comparator 450 and SAR circuit 270. For simplicity, in FIG. 4 a clock generator that generates pulses $Nf_s$ is not shown. In operation, switch S1 may be closed after completion of a phase1 (see FIG. 8) of a current cycle of the operation of the CM SA ADC 400, when comparator 450 is done with comparison of the current sample. In other words, Switch S1 may play an important role in ultra-high-speed operations. First, during switching of CM DAC circuit 410, switch S1 may prevent nodes Xp and Xn from glitching, which can affect operation of comparator 450. Second, for fast settling, switch S1 can be closed, once a comparison has been made, to prevent nodes Xp and Xn from traversing such that these two nodes can settle quickly.

Figure 5:
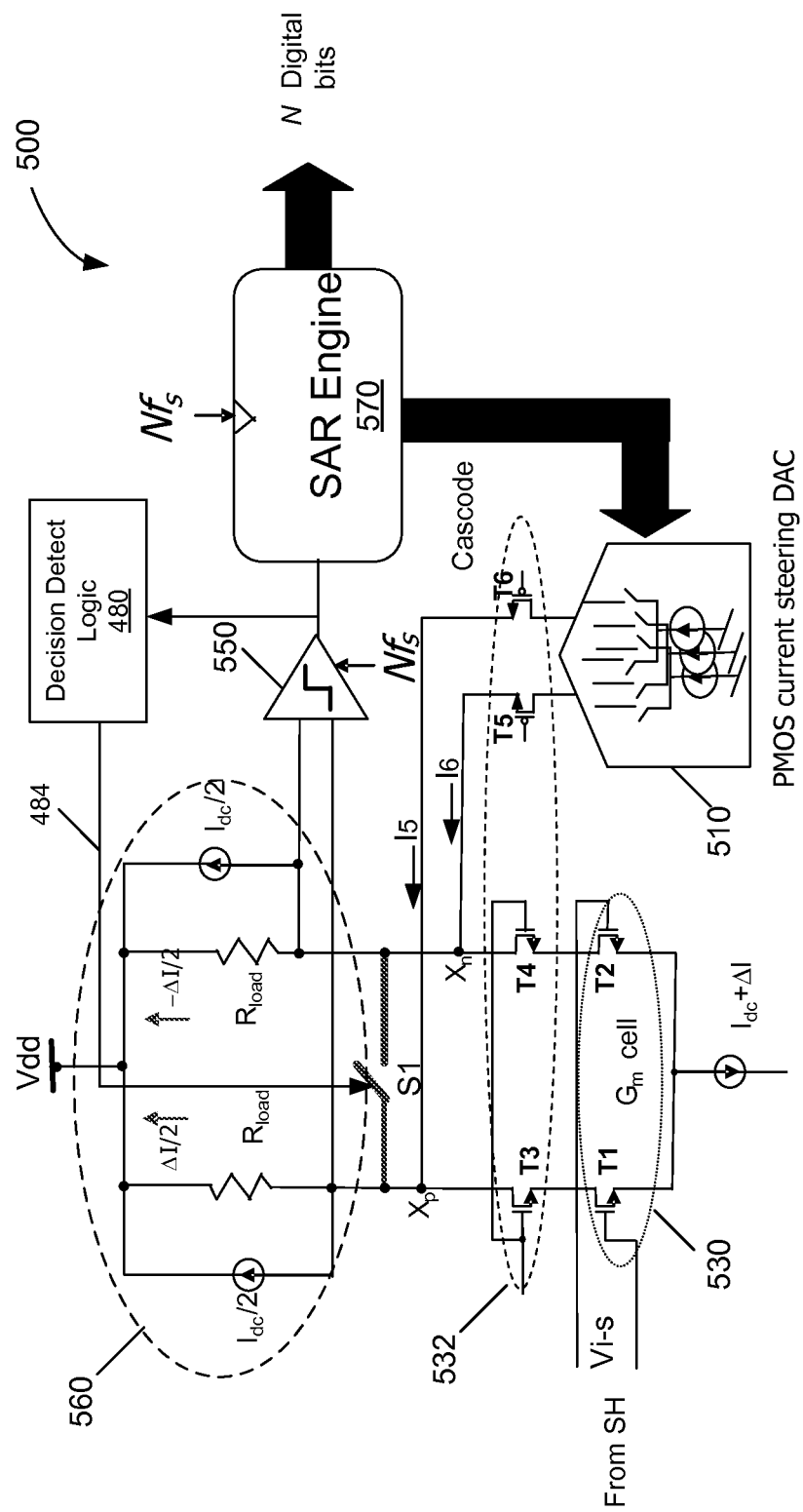
FIG. 5 is a schematic diagram illustrating another exemplary implementation of the CMSA ADC circuit of FIG. 2, in accordance with certain configurations of the present disclosure.

FIG. 5 is a schematic diagram illustrating another example of a CM SA ADC circuit, in accordance with certain configurations of the present disclosure. CMSA ADC circuit 500 may include some or all of the following: a CM DAC circuit 510, a SAR 570, a comparator 550, an error circuit 560, a cascode circuit 532, a switch S1, and a transconductance circuit 530. Comparator 550, SAR 570, and error circuit 560 are respectively similar to comparator 460, SAR 470, and error circuit 460 of FIG. 4. DAC 510 is implemented with PMOS transistors and is configured to counter currents generated by transconductance circuit 530 (e.g., Gm cell). Transconductance circuit 530 and cascode circuit 532 are implemented by NMOS transistors T1 and T2, and NMOS transistors T3, T4, T5, and T6, respectively. Otherwise, the operation of CM SA ADC 500 is similar to operation of CM SA ADC 400 of FIG. 4. For simplicity, in FIG. 5 a clock generator that generates pulses $Nf_s$ is not shown. Operation of switch S1 is controlled by control signal 484 issued by decision detect logic 480 (see FIG. 10), which detects a change in an output of comparator 550 during a regeneration phase of comparator 550 (see FIG.

11), and generates signal 484, which resets the voltage at nodes Xp and Xn. Switch S1 is turned off when signal 484 is returned to zero.

Figure 6:
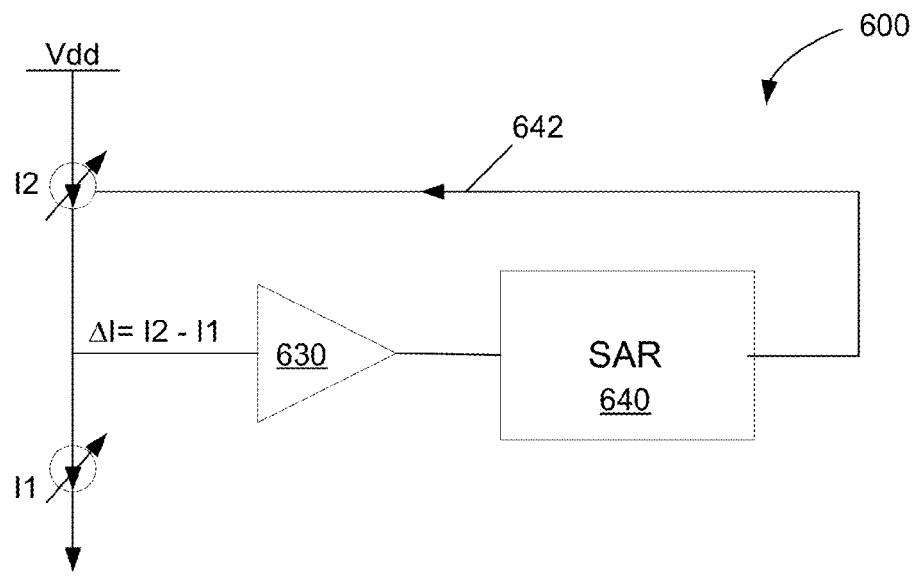
FIG. 6 is a high-level diagram of an example of a CMSA ADC circuit using a current comparator, in accordance with certain configurations of the present disclosure.

FIG. 6 is a high-level diagram of an example of a CMSA ADC circuit using a current comparator, in accordance with certain configurations of the present disclosure. CMSA ADC circuit 600 includes current sources $I_2$ and $I_1$, current comparator 630, and SAR 640. SAR 640 is similar to SAR 570 of FIG. 5. Current comparator 630 is configured to compare current signals instead of voltage signals. Current source $I_2$ is a variable current source that represents a CM DAC circuit (e.g. CM DAC circuit 510 of FIG. 5). Current source $I_1$ is also a variable current source and represent a current drawn by a transconductance circuit (e.g., transconductance circuit 530 of FIG. 5). Otherwise, the operation of CMSA ADC circuit 600 is similar to the operation of CMSA ADC circuit 500 of FIG. 5.

Figure 7:
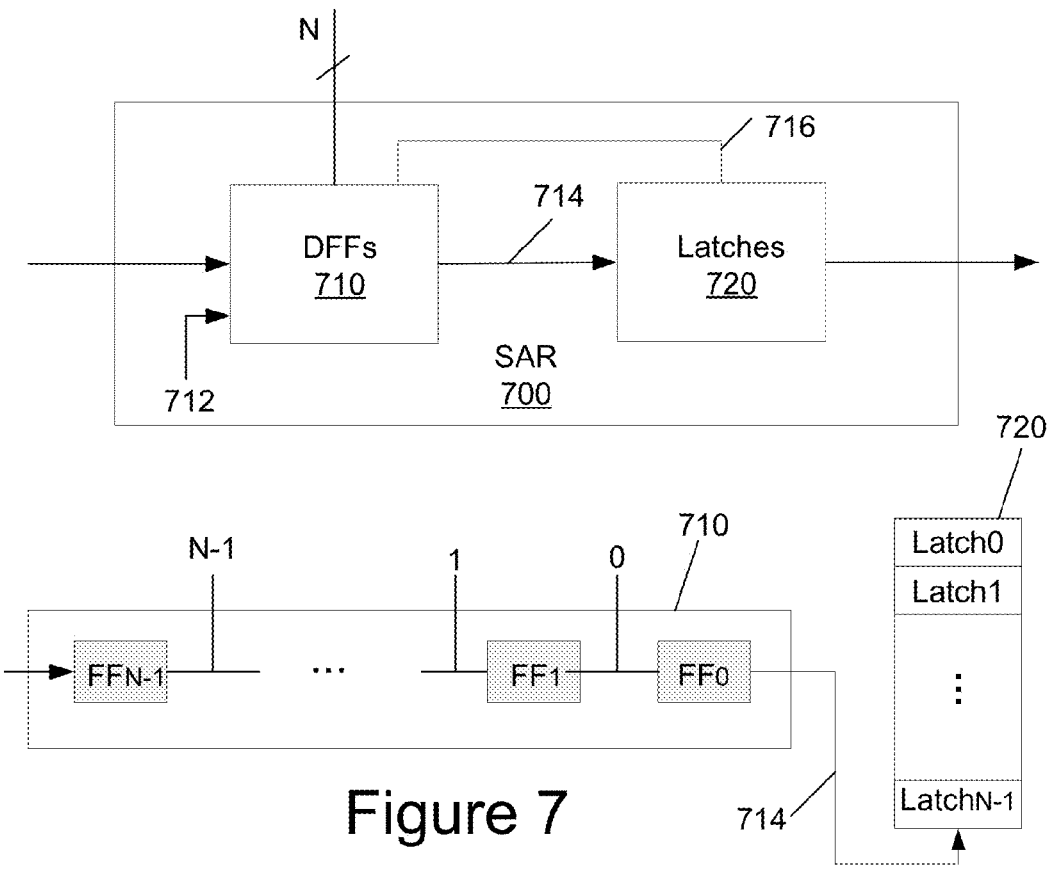
FIG. 7 is a block diagram illustrating an exemplary implementation of a successive approximation register (SAR) circuit of the CMSA ADC circuit of FIG. 2, in accordance with certain configurations of the present disclosure.

FIG. 7 is a block diagram illustrating an exemplary implementation of a successive approximation register (SAR) circuit, in accordance with certain configurations of the present disclosure. SAR 700 may include a register circuit 710 formed by, for example, D-flip-flops (DFFs) and a latch circuit 720. Latch circuit 720 includes N latches (latch$_0$-latch$_{N-1}$) that can hold the N bits of the N-bit digital output signal (e.g., digital output signal 472 of FIG. 4) at the completion of the conversion. DFF cells FF$_0$-FF$_{N-1}$ of register circuit 710 can generate N bits of an N-bit digital signal (e.g., digital signal 474 of FIG. 4), which may be used by CM DAC circuit 410 to control DAC current. For example, if N=8, initially (i.e., in the first cycle), bit 7 of register circuit 710 is tentatively set to 1 and other bits are set to 0 (e.g., producing mid-code 1000,0000). The comparison results then determine whether bit 7 remains high or not at the next cycle. In the next cycle, no matter bit 7 remains high or not, based on the previous comparison result, bit 6 of register circuit 710 is tentatively set to 1. Finally, in the 8th cycle, bit 0 of register circuit 710 is determined, which concludes the SAR cycles for estimating the current sample of the sampled-input voltage signal. At this point, the N bits (716) are stored in latches of latch circuit 720, in response to an end of conversion signal 714, and are ready to be used by any circuit connected to the output port of SAR 700.

Figure 8:
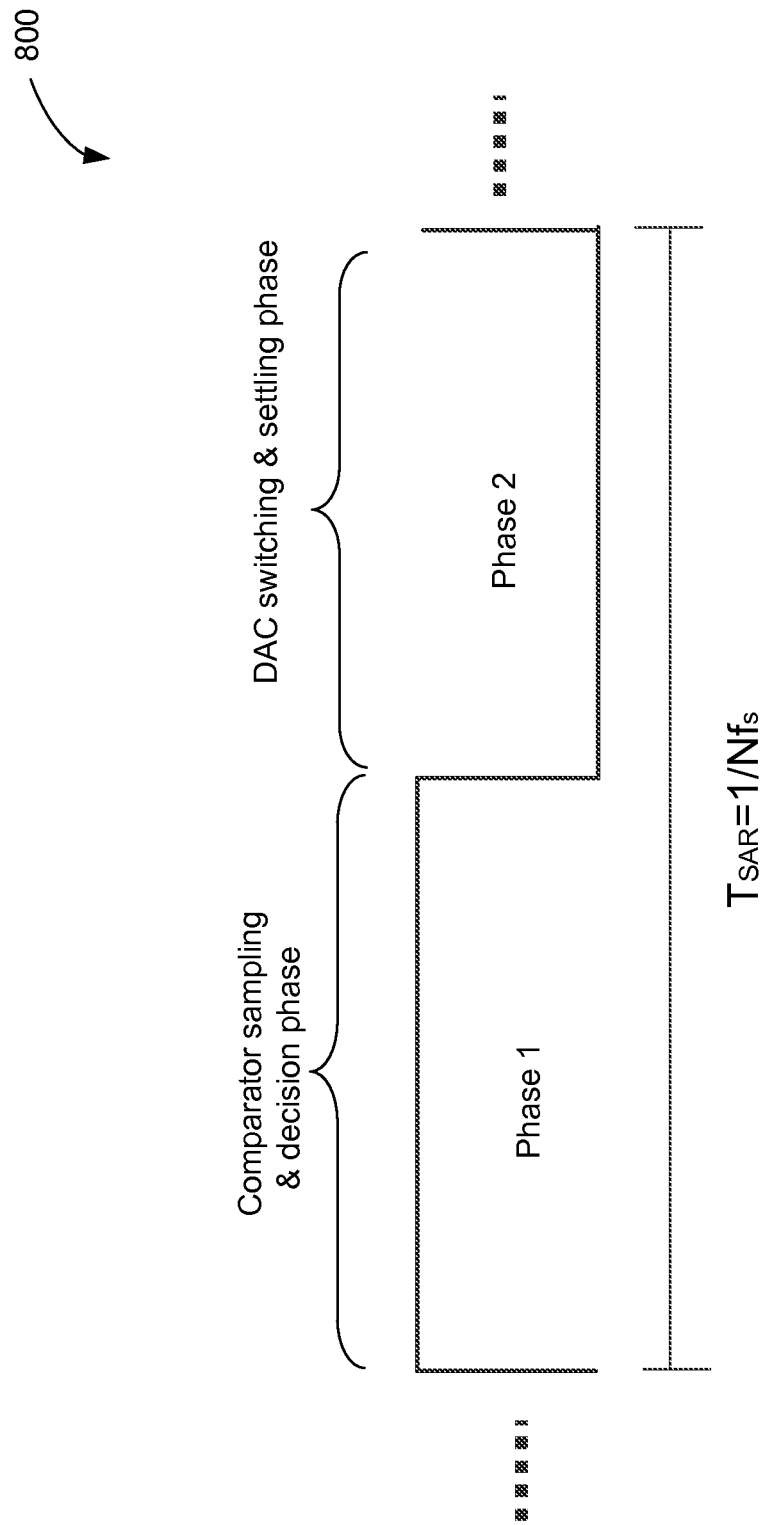
FIG. 8 is a timing diagram illustrating an example of a timing period of the SAR circuit used in the CMSA ADC circuit of FIG. 2, in accordance with certain configurations of the present disclosure.

FIG. 8 is a timing diagram illustrating an example of a time period of the SAR circuit used in the CMSA ADC circuit 400 circuit of FIG. 4, in accordance with certain configurations of the present disclosure. Time period 800 represents one of N cycles of SAR 470 and lasts for a time $T_{SAR}=1/Nf_s$, where $f_s$ is the sampling rate (e.g., for SH circuit 240 of FIG. 2). Each period (i.e., each cycle) includes two phases including a phase 1 and a phase 2. In phase 1 of a current cycle, comparator 450 of FIG. 4 may complete comparison of the current resulting from the sampled input voltage signal Vi-s with current DAC current $I_{dac}$. At the end of phase 1, clock generator 480 of FIG. 4 may send control signal 484 of FIG. 4 to close switch S1 of FIG. 4, thereby returning the comparator signal to zero. At phase 2, SAR 470 and CM DAC circuit 410 can operate, and by the end of phase 2, CM DAC 410 circuit can settle and be ready for the next cycle of SAR operation.

Figure 9B:
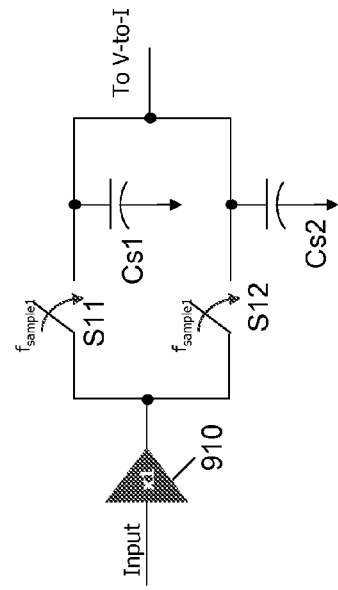
FIG. 9B is a diagram illustrating another example of a SH circuit, in accordance with certain configurations of the present disclosure.
Figure 9D:
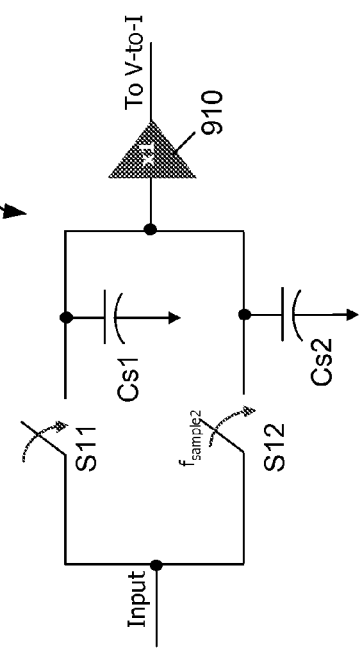
FIG. 9D is a diagram illustrating another example of a double-speed SH circuit, in accordance with certain configurations of the present disclosure.
Figure 9A:
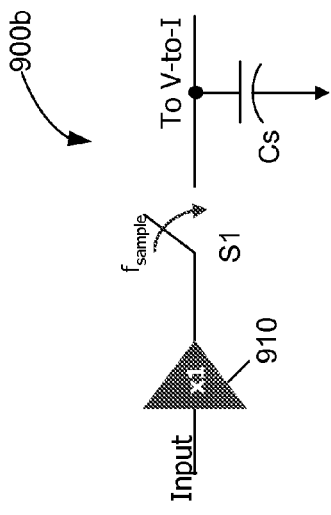
FIG. 9A is a diagram illustrating an example of a sample and hold (SH) circuit, in accordance with certain configurations of the present disclosure.

FIG. 9A is a diagram illustrating an example of a sample and hold (SH) circuit, in accordance with certain configurations of the present disclosure. SH circuit 900a may include a switch S1, a sampling capacitor $C_s$, and a buffer circuit 910. Switch S1 operates at a sampling rate $f_s$ (i.e., $f_{sample}$) (e.g., 500 MHz). When switch S1 is closed, during a first portion of the sampling period Ts (Ts=1/$f_s$), input signal can charge capacitor $C_s$, which can hold the charge during the next portion of the sampling period. The voltage produced across electrodes of capacitor $C_s$ then can appear, as a sampled-input voltage signal, at the output port of buffer circuit 910. Buffer circuit 910 may comprise an amplifier with high input impedance and a gain of unity, and can operate to isolate the transconductance circuit (e.g., transconductance circuit 230 of FIG. 2) from the capacitor $C_s$ during charging period of this capacitor.

FIG. 9B is a diagram illustrating another example of a SH circuit, in accordance with certain configurations of the present disclosure. SH circuit 900b may include a switch S1, a sampling capacitor $C_s$, and a buffer circuit 910. The operation of SH circuit 900b is similar to SH circuit 900a, except that buffer circuit 910 is positioned before switch S1. Buffer circuit 910, in this configuration, can operate to isolate the input voltage source from capacitor $C_s$ during charging period of this capacitor, in other words, buffer circuit 910 can provide current required for charging capacitor Cs, where input voltage source may not be able to provide such current.

Figure 9C:
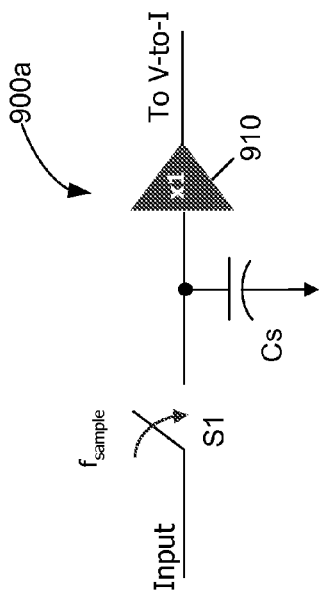
FIG. 9C is a diagram illustrating an example of a double-speed SH circuit, in accordance with certain configurations of the present disclosure.

FIG. 9C is a diagram illustrating an example of a double-speed SH circuit, in accordance with certain configurations of the present disclosure. Double-speed SH circuit 900c may include two SH circuits that can be similar to SH circuit 900a, connected in parallel, which can operate in a ping-pong mode, thereby having an operating frequency double the operating frequency of SH circuits 900a. In other words, when switch $S_{11}$ is closed and $C_{s1}$ can be charging, switch $S_{12}$ is open, and $C_{s2}$ can be holding charge and vice versa.

FIG. 9D is a diagram illustrating another example of a double-speed SH circuit, in accordance with certain configurations of the present disclosure. Double-speed SH circuit 900d may include two SH circuits that can be similar to SH circuit 900b, connected in parallel, which can operate in a ping-pong mode, thereby having an operating frequency double the operating frequency of SH circuits 900b.

Figure 10:
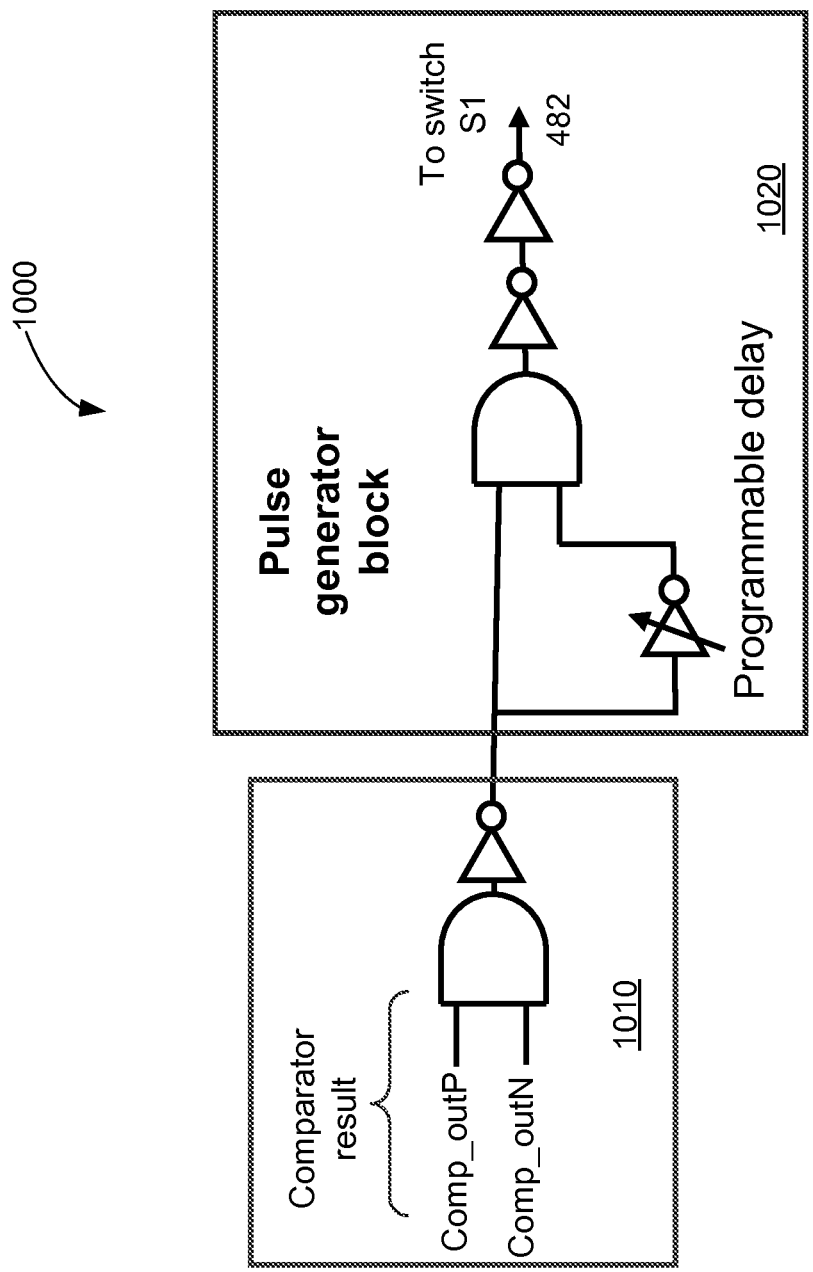
FIG. 10 is a diagram illustrating an example of a decision detect logic, in accordance with certain configurations of the present disclosure.

FIG. 10 is a diagram illustrating an example of a decision detect logic 1000, in accordance with certain configurations of the present disclosure. Decision logic 1000 is an example implementation of decision logic 480 of FIGS. 4 and 5 that generates control signal 482, which in turn controls operation of switch S1 of FIGS. 4 and 5. A logic 1010 detects a change in an output of comparator 450 of FIG. 4 (or 550 of FIG. 5), during a regeneration phase of comparator 450, and generates an output pulse. The output pulse is received by pulse generator block 1020, where a width (i.e. duration) of the output pulse is programably adjusted through a chain of inverters.

Figure 11:
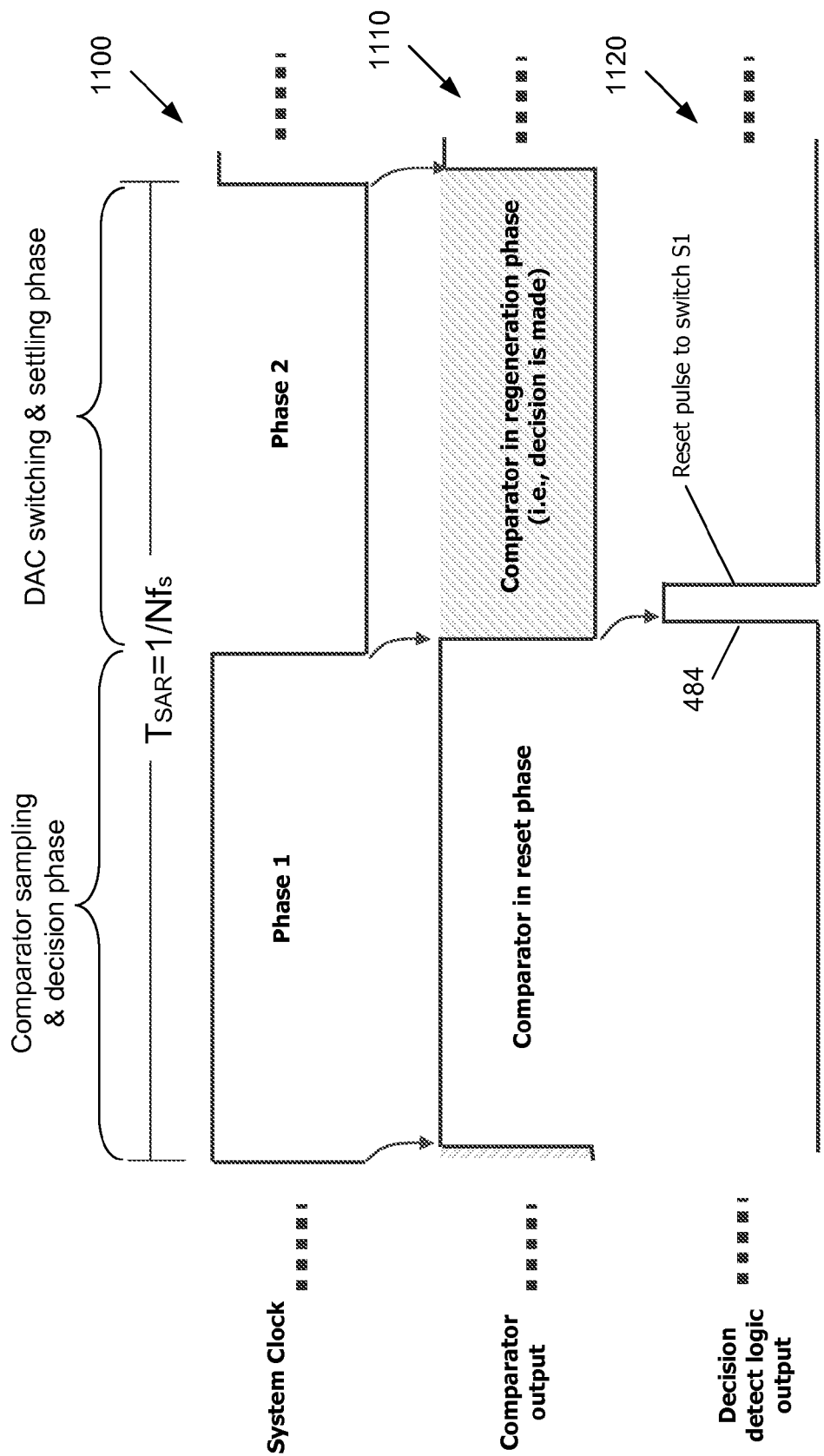
FIG. 11 is a timing diagram illustrating timing periods and a control signal of CMSA ADC circuit of FIG. 4, in accordance with certain configurations of the present disclosure.

FIG. 11 is a timing diagram illustrating examples of timing periods and a control signal of CMSA ADC circuit of FIG. 4, in accordance with certain configurations of the present disclosure. A time period 1100 is similar to time period 800 of FIG. 8. A timing period 1110 shows relation between comparator reset phase and regeneration phase (e.g., the phase during which decision on comparison is made) and phase 1 and phase 2 of SAR 470, respectively. The reset and regeneration phases of comparator 450 start briefly after phase 1 and phase 2 of SAR 470, respectively. The control signal 1120 is the same as control signal 482 generated by decision detect logic 1000 of FIG. 10. Control signal 482 is generated briefly after comparator 450 transitions from the reset phase to the regeneration phase.

Further Description of Subject Disclosure

Various examples of aspects of the disclosure are described below. These are provided as examples, and do not limit the subject technology. Identifications of the figures and reference numbers are provided below merely as examples and for illustrative purposes, and the descriptions are not limited by those identifications.

Broadly and generally, in one aspect, the present disclosure provides an analog-to-digital converter (ADC) (e.g., CM SA ADC circuit 200 of FIG. 2) circuit to convert an analog input signal to a digital output signal. The ADC circuit may comprise a current mode (CM) digital-to-analog converter (DAC) circuit configured to provide a DAC current (e.g., CM DAC circuit 210 of FIG. 2). A transconductance circuit may be configured to derive an input current from the analog input signal (e.g., transconductance circuit 230 of FIG. 2). The ADC circuit may also comprise a comparator circuit configured to generate a comparator signal in response to an error signal determined based on the DAC current and the input current (e.g., comparator circuit 250 of FIG. 2). A successive approximation register (SAR) circuit may be configured to receive the comparator signal and to generate at least one of a DAC-code signal or the digital output signal (e.g., SAR circuit 270 of FIG. 2). The DAC-code signal (e.g., DAC signal 274 of FIG. 2) may be used by the CM DAC circuit to control the DAC current.

In an aspect of the disclosure, an n-bit analog-to-digital converter (ADC) circuit to convert an analog input signal to a digital output signal (e.g., CM SA ADC circuit 200 of FIG. 2) may comprise one or more of the following: a current mode (CM) digital-to-analog converter (DAC) circuit to provide a DAC current (e.g., CM DAC circuit 210 of FIG. 2), a comparator circuit may be configured to generate a comparator signal in response to an error signal determined based on the DAC current and the analog input signal (e.g., comparator circuit 250 of FIG. 2), a successive approximation register (SAR) circuit may be configured to generate at least one of a DAC-code signal or the digital output signal, in response to the comparator signal (e.g., SAR circuit 270 of FIG. 2), the DAC-code signal (e.g., DAC signal 274 of FIG. 2) may be used by the CM DAC circuit to control the DAC current.

Figure 12:
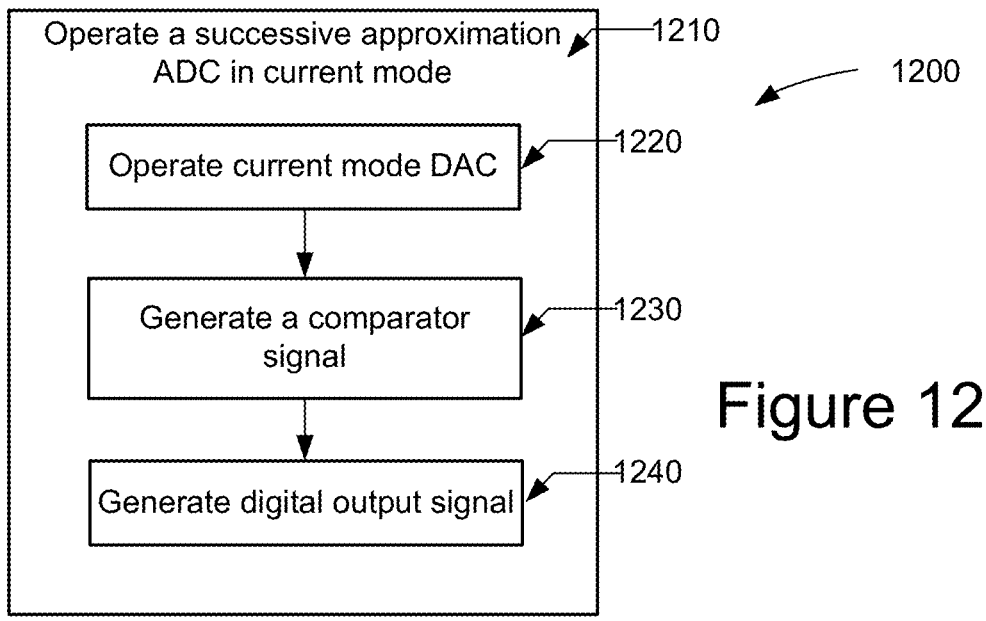
FIG. 12 is a flow diagram of an example of a method for operating a CMSA ADC circuit, in accordance with certain configurations of the present disclosure.

In another aspect of the disclosure, a method may be provided for converting an analog input signal to a digital output signal (e.g., 1200 of FIG. 12). The method may comprise operating a successive approximation analog-to-digital converter (ADC) circuit in a current-conversion mode (e.g., 1210 of FIG. 12) by: operating a current mode (CM) digital-to-analog converter (DAC) circuit to provide a DAC current (e.g., 1220 of FIG. 12), operating a comparator circuit to generate a comparator signal in response to an error signal determined based on the DAC current and the analog input signal (e.g., 1230 of FIG. 12), and operating a successive approximation register (SAR) circuit to generate at least one of a DAC-code signal or the digital output signal, in response to the comparator signal (e.g., 1240 of FIG. 12), wherein operating the CM DAC circuit includes controlling the DAC current by using the DAC-code signal.

Figure 13:
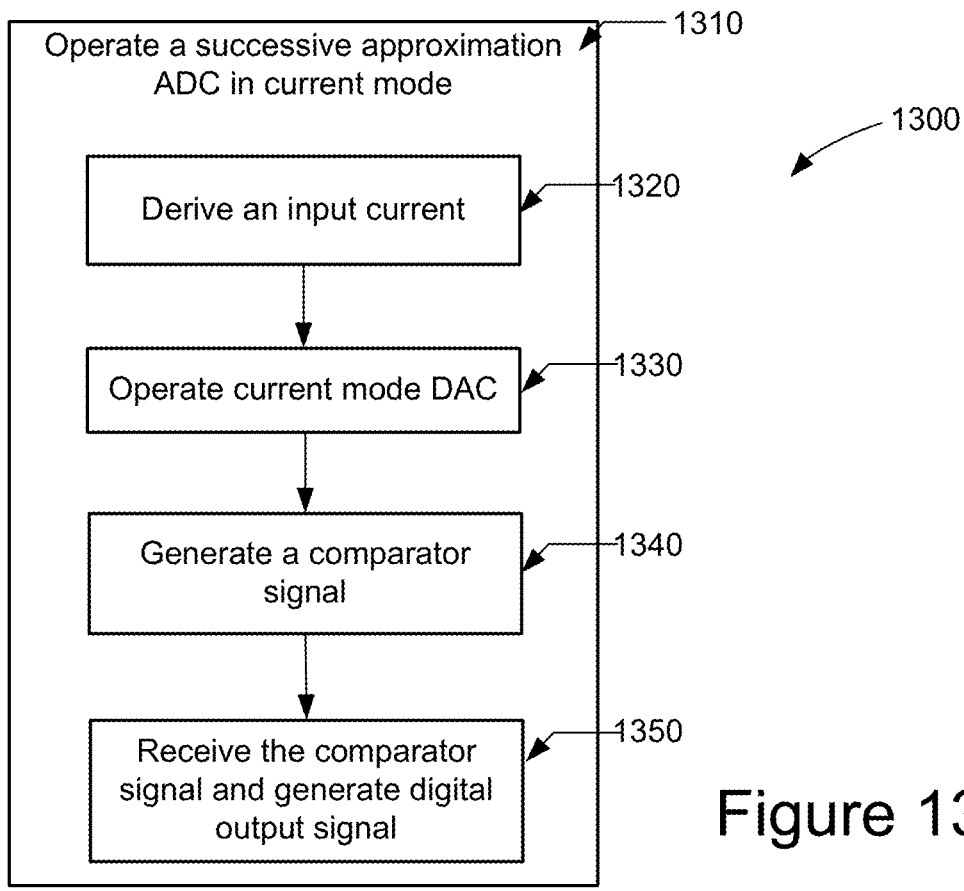
FIG. 13 is a flow diagram of anther example of a method for operating a CMSA ADC circuit, in accordance with certain configurations of the present disclosure.

In yet another aspect of the disclosure, a method may be provided for converting an analog input signal to a digital output signal (e.g., method 1300 of FIG. 13). The method may comprise operating a successive approximation analog-to-digital converter (ADC) circuit in a current-conversion mode (e.g., 1310 of FIG. 13) by: operating a transconductance circuit to derive an input current from the analog input signal (e.g., 1320 of FIG. 13), operating a current mode (CM) digital-to-analog converter (DAC) circuit to provide a DAC current (e.g., 1330 of FIG. 123), operating a comparator circuit to generate a comparator signal in response to an error signal determined based on the DAC current and the input current (e.g., 1340 of FIG. 13), and operating a successive approximation register (SAR) circuit to receive the comparator signal and to generate at least one of a DAC-code signal or the digital output signal (e.g., 1350 of FIG. 13), wherein operating the CM DAC circuit includes controlling the DAC current by using the DAC-code signal.

Illustrations of Subject Disclosure Using Clauses

Various examples of aspects of the disclosure are described as numbered clauses (1, 2, 3, etc.) for convenience. These are provided as examples, and do not limit the subject technology. Identifications of the figures and reference numbers are provided below merely as examples and for illustrative purposes, and the clauses are not limited by those identifications.

1. An analog-to-digital converter (ADC) circuit to convert an analog input signal to a digital output signal, the ADC circuit comprising:

a current mode (CM) digital-to-analog converter (DAC) circuit configured to provide a DAC current;

a transconductance circuit configured to derive an input current based on the analog input signal;

a comparator circuit configured to generate a comparator signal in response to an error signal determined based on the DAC current and the input current; and a successive approximation register (SAR) circuit configured to receive the comparator signal and to generate at least one of a DAC-code signal or the digital output signal, wherein the CM DAC circuit is configured to use the DAC-code signal to control the DAC current.

2. The ADC circuit of clause 1, wherein the CM DAC circuit comprises a decoder circuit configured to decode the DAC-code signal into a control signal.

3. The ADC circuit of clause 2, wherein the CM DAC circuit is configured to use the control signal to control the DAC current.

4. The ADC circuit of clause 2, wherein the CM DAC circuit comprises a plurality of current sources, and wherein at least one or more of the plurality of current sources are configured to provide the DAC current, based on the control signal.

5. The ADC circuit of clause 1, wherein the CM DAC circuit is configured to provide the DAC current through a first cascode circuit (e.g., 432, 532 or a portion thereof in FIGS. 4 and 5), and wherein the DAC current is a differential current.

6. The ADC circuit of clause 1, further comprising an error circuit configured to provide a voltage error signal determined based on a difference between the DAC current and the input current, and wherein the error circuit comprises a switch to reduce glitches in the voltage error signal.

7. The ADC circuit of clause 1, further comprising a sample and hold (SH) circuit configured to derive a sampled-input signal from the analog input signal.

8. The ADC circuit of clause 7, wherein the transconductance circuit is further configured to derive the input current from the sampled-input signal.

9. The ADC circuit of clause 8, wherein the transconductance circuit is configured to provide a differential input current through a second cascode circuit (e.g., 432, 532 or a portion thereof in FIGS. 4 and 5).

10. The ADC circuit of clause 1, wherein the SAR circuit is configured to generate the digital output signal at a last cycle of a plurality of SAR cycles.

11. The ADC circuit of clause 10, wherein the SAR circuit is configured to generate, at a first cycle of the plurality of SAR cycles, the DAC-code signal that comprises a mid-code.

12. An analog-to-digital converter (ADC) circuit to convert an analog input signal to a digital output signal, the ADC circuit comprising:

a current mode (CM) digital-to-analog converter (DAC) circuit configured to provide a DAC current;

a comparator circuit configured to generate a comparator signal in response to an error signal determined based on the DAC current and the analog input signal; and a successive approximation register (SAR) circuit configured to generate at least one of a DAC-code signal or the digital output signal, in response to the comparator signal, wherein the CM DAC circuit is configured to use the DAC-code signal to control the DAC current.

Various examples of aspects of the disclosure are described as numbered clauses (1, 2, 3, etc.) for convenience. These are provided as examples, and do not limit the subject technology. Identifications of the figures and reference numbers are provided below merely as examples and for illustrative purposes, and the clauses are not limited by those identifications.

1. A method of converting an analog input signal to a digital output signal, the method comprising:
   operating a successive approximation analog-to-digital converter (ADC) circuit in a current-conversion mode by:
   deriving an input current based on the analog input signal;
   operating a current mode (CM) digital-to-analog converter (DAC) circuit to provide a DAC current;
   generating a comparator signal in response to an error signal determined based on the DAC current and the input current; and
   receiving the comparator signal and generating at least one of a DAC-code signal or the digital output signal,
   wherein operating the CM DAC circuit includes controlling the DAC current by using the DAC-code signal.
2. The method of clause 1, wherein operating the CM DAC circuit comprises decoding the DAC-code signal into a control signal.
3. The method of clause 2, wherein operating the CM DAC circuit comprises using the control signal to control the DAC current.
4. The method of clause 2, wherein operating the CM DAC circuit comprises operating a plurality of current sources, and further comprising operating at least one or more of the plurality of current sources to provide the DAC current, based on the control signal.
5. The method of clause 2, wherein operating the CM DAC circuit comprises providing the DAC current through a first cascode circuit, and wherein the DAC current is a differential current.
6. The method of clause 1, further comprising providing a voltage error signal determined based on a difference between the DAC current and the input current and wherein the providing the voltage error signal comprises operating a switch to reduce glitches in the voltage error signal.
7. The method of clause 1, wherein deriving the input current comprises deriving the input current from a sampled-input signal.

Various examples of aspects of the disclosure are described as numbered clauses (1, 2, 3, etc.) for convenience. These are provided as examples, and do not limit the subject technology. Identifications of the figures and reference numbers are provided below merely as examples and for illustrative purposes, and the clauses are not limited by those identifications.

Figure 14:
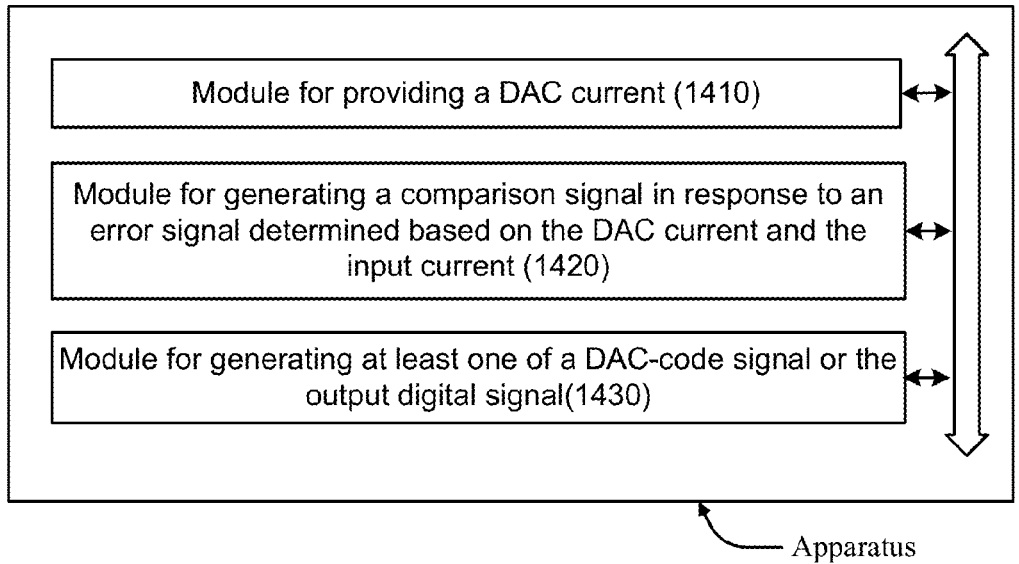
FIGS. 14-15 are block diagrams of examples of an apparatus for performing SA analog-to-digital conversions.
Figure 15:
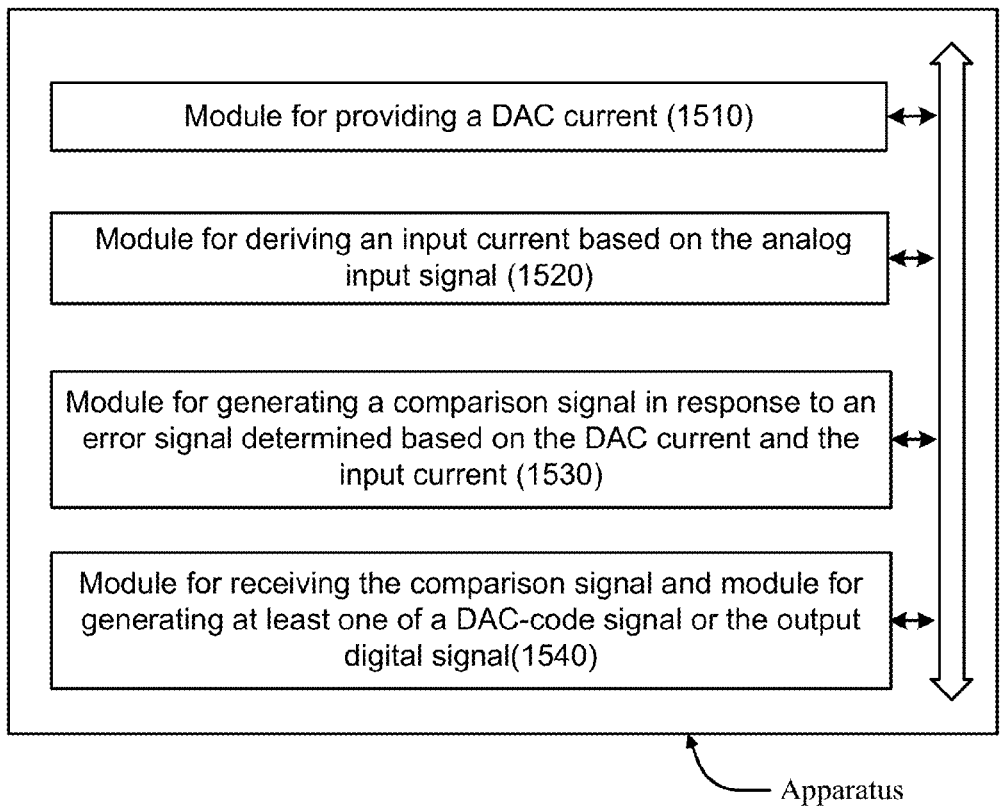

1. An apparatus to convert an analog input signal to a digital output signal, the apparatus comprising:
   means for providing a DAC current (e.g., 1510, of FIG. 15);
   means for deriving an input current based on the analog input signal (e.g., 1520, of FIG. 15);
   means for generating a comparator signal in response to an error signal determined based on the DAC current and the input current (e.g., 1530, of FIG. 15);
   means for receiving the comparator signal (e.g., 1540, of FIG. 15); and
   means for generating at least one of a DAC-code signal or the digital output signal (e.g., 1540, of FIG. 15),
   wherein the means for providing the DAC current is configured to control the DAC current using the DAC-code signal.
2. The apparatus of clause 1, wherein the means for providing the DAC current comprises means for decoding the DAC-code signal into a control signal.
3. The apparatus of clause 2, wherein the means for providing the DAC current is configured to use the control signal to control the DAC current.
4. The apparatus of clause 2, wherein the means for providing the DAC current comprises a plurality of current sources, and wherein at least one or more of the plurality of current sources are configured to provide the DAC current, based on the control signal.
5. The apparatus of clause 1, wherein the means for providing the DAC current is configured to provide the DAC current through a first cascode circuit, and wherein the DAC current is a differential current.
6. The apparatus of clause 1, further comprising means for providing a voltage error signal determined based on a difference between the DAC current and the input current, and wherein the means for providing the voltage error signal comprises means for reducing glitches in the voltage error signal.
7. The apparatus of clause 1, further comprising means for deriving a sampled-input signal from the analog input signal.
8. The apparatus of clause 7, wherein the means for deriving the input current based on the analog input signal is configured to derive the input current from the sampled-input signal.
9. The apparatus of clause 8, wherein the means for deriving the input current based on the analog input signal is configured to provide a differential input current through a second cascode circuit.
10. The apparatus of clause 1, wherein the means for receiving the comparator signal and generating at least one of the DAC-code signal or the digital output signal is configured to generate the digital output signal at a last cycle of a plurality of SAR cycles.
11. The apparatus of clause 10, wherein the means for generating at least one of the DAC-code signal or the digital output signal is configured to generate, at a first cycle of the plurality of SAR cycles, the DAC-code signal that comprises a mid-code.
12. An apparatus for converting an analog input signal to a digital output signal, the apparatus comprising:
    means for providing a DAC current (e.g., 1410, of FIG. 14);
    means for generating a comparator signal in response to an error signal determined based on the DAC current and the analog input signal (e.g., 1420, of FIG. 14); and
    means for generating at least one of a DAC-code signal or the digital output signal, in response to the comparator signal (e.g., 1430, of FIG. 14),
    wherein the means for providing the DAC current is configured to use the DAC-code signal to control the DAC current.

Other Remarks

In one aspect, any of the clauses herein may depend from any one of the independent clauses or any one of the dependent clauses. In one aspect, any of the clauses (e.g., dependent or independent clauses) may be combined with any other clauses (e.g., dependent or independent clauses). In one aspect, a claim may include some or all of the words (e.g., steps, operations, means or components) recited in a clause, a sentence, a phrase or a paragraph. In one aspect, a claim may include some or all of the words recited in one or more clauses, sentences, phrases or paragraphs. In one aspect, some of the words in each of the clauses, sentences, phrases or paragraphs may be removed. In one aspect, additional words or elements may be added to a clause, a sentence, a phrase or a paragraph. In one aspect, the subject technology may be implemented without utilizing some of the components, elements, functions or operations described herein. In one aspect, the subject technology may be implemented utilizing additional components, elements, functions or operations.

In one aspect, any methods, instructions, code, means, logic, components, blocks, modules and the like (e.g., software or hardware) described or claimed herein can be represented in drawings (e.g., flow charts, block diagrams), such drawings (regardless of whether explicitly shown or not) are expressly incorporated herein by reference, and such drawings (if not yet explicitly shown) can be added to the disclosure without constituting new matter. For brevity, some (but not necessarily all) of the clauses/descriptions/claims are explicitly represented in drawings, but any of the clauses/descriptions/claims can be represented in drawings in a manner similar to those drawings explicitly shown. For example, a flow chart can be drawn for any of the clauses, sentences or claims for a method such that each operation or step is connected to the next operation or step by an arrow. In another example, a block diagram can be drawn for any of the clauses, sentences or claims having means-for elements (e.g., means for performing an action) such that each means-for element can be represented as a module for element (e.g., a module for performing an action).

Those of skill in the art would appreciate that items such as the various illustrative blocks, modules, elements, components, methods, operations, steps, and algorithms described herein may be implemented as hardware or a combination of hardware and software.

To illustrate the interchangeability of hardware and software, items such as the various illustrative blocks, modules, elements, components, methods, operations, steps, and algorithms have been described generally in terms of their functionality. Whether such functionality is implemented as hardware or software depends upon the particular application and design constraints imposed on the overall system. Skilled artisans may implement the described functionality in varying ways for each particular application.

In one aspect, "means," a block, a module, an element, a component or a processor may be an item (e.g., one or more of blocks, modules, elements, components or processors) for performing one or more functions or operations. In one aspect, such an item may be an apparatus, hardware, or a portion thereof. In an example, an item may be implemented as one or more circuits configured to perform the function(s) or operation(s). A circuit may include one or more circuits and/or logic. A circuit may be analog and/or digital. A circuit may be electrical and/or optical. A circuit may include transistors. In an example, one or more items may be implemented as a processing system (e.g., a digital signal processor (DSP), an application specific integrated circuit (ASIC), a field programmable gate array (FPGA), etc.). In one example, an item may also include a structure in the form of, for example, an instruction(s) for performing the function(s) or operation(s), where the instruction(s) are encoded or stored on a machine-readable medium, on another device, or on a portion thereof, where an instruction(s) may be software, an application(s), a subroutine(s), or a portion thereof. Those skilled in the art will recognize how to implement the instructions, circuits, and processing systems.

In one aspect, the term "bipolar junction transistor (BJT)" may refer to any of a variety of multi-terminal transistors generally operating on the principal of carrying current using both electrons and holes, including but not limited to an n-p-n BJT, a p-n-p BJT, and a heterojunction BJT (HBT).

In one aspect, the term "field effect transistor (FET)" may refer to any of a variety of multi-terminal transistors generally operating on the principals of controlling an electric field to control the shape and hence the conductivity of a channel of one type of charge carrier in a semiconductor material, including, but not limited to a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

In one aspect, the terms "base," "emitter," and "collector" may refer to three terminals of a transistor and may refer to a base, an emitter and a collector of a bipolar junction transistor or may refer to a gate, a source, and a drain of a field effect transistor, respectively, and vice versa. In another aspect, the terms "gate," "source," and "drain" may refer to "base," "emitter," and "collector" of a transistor, respectively, and vice versa.

Unless otherwise mentioned, various configurations described in the present disclosure may be implemented on a Silicon, Silicon-Germanium (SiGe), Gallium Arsenide (GaAs), Indium Phosphide (InP) or Indium Gallium Phosphide (InGaP) substrate, or any other suitable substrate.

A reference to an element in the singular is not intended to mean "one and only one" unless specifically so stated, but rather "one or more." For example, a clock signal may refer to one or more clock signals, a control signal may refer to one or more control signals, an input signal may refer to one or more input signals, an output signal may refer to one or more output signals, and a signal may refer to differential voltage signals.

Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The word "exemplary" is used herein to mean "serving as an example or illustration." Any aspect or design described herein as "exemplary" is not necessarily to be construed as preferred or advantageous over other aspects or designs. In one aspect, various alternative configurations and operations described herein may be considered to be at least equivalent.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

In one aspect of the disclosure, when actions or functions are described as being performed by an item (e.g., receiving, determining, providing, generating, converting, displaying, notifying, accepting, selecting, controlling, transmitting, reporting, sending, or any other action or function), it is understood that such actions or functions may be performed by the item directly or indirectly. In one aspect, when a module is described as performing an action, the module may be understood to perform the action directly. In one aspect, when a module is described as performing an action, the module may be understood to perform the action indirectly, for example, by facilitating, enabling or causing such an action.

In one aspect, unless otherwise stated, all measurements, values, ratings, positions, magnitudes, sizes, and other specifications that are set forth in this specification, including in the claims that follow, are approximate, not exact. In one aspect, they are intended to have a reasonable range that is consistent with the functions to which they relate and with what is customary in the art to which they pertain.

In one aspect, the term "coupled" or the like may refer to being directly coupled. In another aspect, the term "coupled" or the like may refer to being indirectly coupled.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

Various items may be arranged differently (e.g., arranged in a different order, or partitioned in a different way) all without departing from the scope of the subject technology. In one aspect of the disclosure, the elements recited in the accompanying claims may be performed by one or more modules or sub-modules.

It is understood that the specific order or hierarchy of steps, operations or processes disclosed is an illustration of exemplary approaches. Based upon design preferences, it is understood that the specific order or hierarchy of steps, operations or processes may be rearranged. Some of the steps, operations or processes may be performed simultaneously. The accompanying method claims, if any, present elements of the various steps, operations or processes in a sample order, and are not meant to be limited to the specific order or hierarchy presented.

The disclosure is provided to enable any person skilled in the art to practice the various aspects described herein. The disclosure provides various examples of the subject technology, and the subject technology is not limited to these examples. Various modifications to these aspects will be readily apparent to those skilled in the art, and the generic principles defined herein may be applied to other aspects.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used, such term is intended to be inclusive in a manner similar to the term "comprise" as "comprise" is interpreted when employed as a transitional word in a claim.

The Title, Background, Summary, Brief Description of the Drawings and Abstract of the disclosure are hereby incorporated into the disclosure and are provided as illustrative examples of the disclosure, not as restrictive descriptions. It is submitted with the understanding that they will not be used to limit the scope or meaning of the claims. In addition, in the Detailed Description, it can be seen that the description provides illustrative examples and the various features are grouped together in various embodiments for the purpose of streamlining the disclosure. This method of disclosure is not to be interpreted as reflecting an intention that the claimed subject matter requires more features than are expressly recited in each claim. Rather, as the following claims reflect, inventive subject matter lies in less than all features of a single disclosed configuration or operation. The following claims are hereby incorporated into the Detailed Description, with each claim standing on its own as a separately claimed subject matter.

The claims are not intended to be limited to the aspects described herein, but is to be accorded the full scope consistent with the language claims and to encompass all legal equivalents. Notwithstanding, none of the claims are intended to embrace subject matter that fails to satisfy the requirement of 35 U.S.C. §101, 102, or 103, nor should they be interpreted in such a way. Any unintended embracement of such subject matter is hereby disclaimed.

What is claimed is:

1. An analog-to-digital converter (ADC) circuit to convert an analog input signal to a digital output signal, the ADC circuit comprising:
    a current mode (CM) digital-to-analog converter (DAC) circuit configured to provide a DAC current;
    a sample and hold (SH) circuit configured to derive a sampled-input signal from the analog input signal;
    a transconductance circuit configured to derive an input current from the sampled-input signal;
    a comparator circuit configured to generate a comparator signal in response to an error signal determined based on the DAC current and the input current; and
    a successive approximation register (SAR) circuit configured to receive the comparator signal and to generate at least one of a DAC-code signal or the digital output signal,
    wherein the CM DAC circuit is configured to use the DAC-code signal to control the DAC current.

2. The ADC circuit of claim 1, wherein the CM DAC circuit comprises a decoder circuit configured to decode the DAC-code signal into a control signal.

3. The ADC circuit of claim 2, wherein the CM DAC circuit is configured to use the control signal to control the DAC current.

4. The ADC circuit of claim 2, wherein the CM DAC circuit comprises a plurality of current sources, and wherein at least one of the plurality of current sources is configured to provide the DAC current, based on the control signal.

5. The ADC circuit of claim 1, wherein the CM DAC circuit is configured to provide the DAC current through a first cascode circuit, and wherein the DAC current is a differential current.

6. The ADC circuit of claim 1, further comprising an error circuit configured to provide a voltage error signal determined based on a difference between the DAC current and the input current, and wherein the error circuit comprises a switch to reduce glitches in the voltage error signal.

7. The ADC circuit of claim 1, wherein the transconductance circuit is configured to provide a differential input current through a second cascode circuit.

8. The ADC circuit of claim 1, wherein the SAR circuit is configured to generate the digital output signal at a last cycle of a plurality of SAR cycles.

9. The ADC circuit of claim 1, wherein the SAR circuit is configured to generate, at a first cycle of a plurality of SAR cycles, the DAC-code signal that comprises a mid-code.

10. An analog-to-digital converter (ADC) circuit to convert an analog input signal to a digital output signal, the ADC circuit comprising:
- a current mode (CM) digital-to-analog converter (DAC) circuit configured to provide a DAC current through a first cascode circuit;
- a comparator circuit configured to generate a comparator signal in response to an error signal determined based on the DAC current and the analog input signal; and
- a successive approximation register (SAR) circuit configured to generate at least one of a DAC-code signal or the digital output signal, in response to the comparator signal, wherein the CM DAC circuit is configured to use the DAC-code signal to control the DAC current, wherein the DAC current is a differential current.

11. A method of converting an analog input signal to a digital output signal, the method comprising:
- operating a successive approximation analog-to-digital converter (ADC) circuit in a current-conversion mode by:
  - deriving an input current based on the analog input signal;
  - operating a current mode (CM) digital-to-analog converter (DAC) circuit to provide a DAC current through a first cascode circuit;
  - generating a comparator signal in response to an error signal determined based on the DAC current and the input current; and
  - receiving the comparator signal and generating at least one of a DAC-code signal or the digital output signal,
  wherein operating the CM DAC circuit includes controlling the DAC current by using the DAC-code signal, and wherein the DAC current is a differential current.

12. The method of claim 11, wherein operating the CM DAC circuit comprises decoding the DAC-code signal into a control signal.

13. The method of claim 12, wherein operating the CM DAC circuit comprises using the control signal to control the DAC current.

14. The method of claim 12, wherein operating the CM DAC circuit comprises operating a plurality of current sources, and further comprising operating at least one of the plurality of current sources to provide the DAC current, based on the control signal.

15. The method of claim 11, further comprising providing a voltage error signal determined based on a difference between the DAC current and the input current and wherein providing the voltage error signal comprises operating a switch to reduce glitches in the voltage error signal.

16. The method of claim 11, wherein deriving the input current comprises deriving the input current from a sampled-input signal provided.

17. An apparatus for converting an analog input signal to a digital output signal, the apparatus comprising:
- means for providing a DAC current;
- means for generating a comparator signal in response to an error signal determined based on the DAC current and the analog input signal; and
- means for generating at least one of a DAC-code signal or the digital output signal, in response to the comparator signal,
- wherein the means for providing the DAC current comprises a first cascode circuit, and the means for providing the DAC current is configured to use the DAC-code signal to control the DAC current, and wherein the DAC current is a differential current.

\* \* \* \* \*